(12) United States Patent
Yi et al.

(10) Patent No.: US 8,053,163 B2
(45) Date of Patent: Nov. 8, 2011

(54) METHOD OF FINE PATTERNING SEMICONDUCTOR DEVICE

(75) Inventors: Shi-Yong Yi, Seongnam (KR); Kyoung-Taek Kim, Incheon (KR); Hyun-Woo Kim, Seongnam (KR); Dong-Ki Yoon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 433 days.

(21) Appl. No.: 12/283,449

(22) Filed: Sep. 12, 2008

(65) Prior Publication Data

US 2009/0155725 A1 Jun. 18, 2009

(30) Foreign Application Priority Data

Dec. 14, 2007 (KR) .................. 10-2007-0131049

(51) Int. Cl.
*G03F 7/00* (2006.01)
*G03F 7/004* (2006.01)
*G03F 7/20* (2006.01)

(52) U.S. Cl. .................. 430/270.1; 430/273.1; 430/312; 430/331

(58) Field of Classification Search ............... 430/270.1, 430/273.1, 331; 427/558, 385.5
See application file for complete search history.

(56) References Cited

U.S. PATENT DOCUMENTS

| | | | |
|---|---|---|---|
| 6,746,825 B2 * | 6/2004 | Nealey et al. ................. 430/315 |
| 7,189,435 B2 * | 3/2007 | Tuominen et al. ............ 427/472 |
| 7,560,141 B1 * | 7/2009 | Kim et al. .................. 427/372.2 |
| 7,651,735 B2 * | 1/2010 | Cheng et al. ................. 427/256 |
| 7,723,009 B2 * | 5/2010 | Sandhu et al. ............. 430/270.1 |
| 7,811,940 B2 * | 10/2010 | Sandhu ........................ 438/717 |
| 2006/0134556 A1 | 6/2006 | Nealey et al. |
| 2007/0224819 A1 | 9/2007 | Sandhu |
| 2007/0224823 A1 | 9/2007 | Sandhu |
| 2009/0087664 A1 * | 4/2009 | Nealey et al. .............. 428/411.1 |
| 2009/0191713 A1 * | 7/2009 | Yoon et al. .................... 438/703 |
| 2009/0236309 A1 * | 9/2009 | Millward et al. ............... 216/39 |
| 2010/0190114 A1 * | 7/2010 | Sandhu et al. ................ 430/323 |

OTHER PUBLICATIONS

"Non-Centrosymmetric Superlattice in Block Copolymer Blends" to Thorsten Goldacker et al., Nature, vol. 398, Mar. 11, 1999.

* cited by examiner

*Primary Examiner* — Amanda C. Walke
(74) *Attorney, Agent, or Firm* — Monica H. Choi

(57) ABSTRACT

For patterning during integrated circuit fabrication, an image layer is activated for forming a respective first type polymer block at each of two nearest activated areas. A layer of block copolymer is formed on the image layer, and a plurality of the first type polymer blocks and a plurality of second and third types of polymer blocks are formed on an area of the image layer between outer edges of the two nearest activated areas, from the block copolymer. At least one of the first, second, and third types of polymer blocks are removed to form a variety of mask structures.

24 Claims, 7 Drawing Sheets

US 8,053,163 B2

METHOD OF FINE PATTERNING SEMICONDUCTOR DEVICE

CLAIM TO PRIORITY

This application claims priority under 35 USC §119 to Korean Patent Application No. 10-2007-0131049, filed on Dec. 14, 2007 in the Korean Intellectual Property Office, the disclosure of which is incorporated herein in its entirety by reference.

TECHNICAL FIELD

The present invention relates generally to integrated circuit fabrication, and more particularly, to a method of fine patterning semiconductor devices.

BACKGROUND OF THE INVENTION

For patterning during integrated circuit fabrication in the prior art, top-down patterning using photolithography has been widely used. In such top-down patterning, photo-resist is patterned for in turn patterning an underlying target layer. However as integrated circuit dimensions are reduced to nanometers, photolithography with top-down patterning is limited because of properties of photo-resist material.

For example, line resolution and line edge roughness are limited by the large size of polymer molecules of the photo-resist material. In addition, a photo-resist structure that is tall and thin is prone to pattern collapse.

Accordingly, a bottom-up patterning technique using copolymer material has been developed as disclosed in U.S. Patent No. US 2006/0134556 to Nealey et al.

However, even with such bottom-up patterning, a technique for achieving a variety of patterning dimensions is desired. In addition, a technique for achieving dimensions smaller than possible with conventional photolithography is desired.

SUMMARY OF THE INVENTION

Accordingly, in a method of patterning during integrated circuit fabrication in an aspect of the present invention, an image layer is activated for forming a respective first type polymer block at each of two nearest activated areas. In addition, a layer of block copolymer is formed on the image layer, and a plurality of the first type polymer blocks, a plurality of second type polymer blocks, and a plurality of third type polymer blocks are formed on an area of the image layer between outer edges of the two nearest activated areas, from the block copolymer. Furthermore, the first type polymer blocks, the second type polymer blocks, and the third type polymer blocks are different types from each-other such as by being comprised of different material for example.

In an example embodiment of the present invention, three of the first type polymer blocks, four of the second type polymer blocks, and two of the third type polymer blocks are formed on the area of the image layer between the outer edges of the two nearest activated areas.

In a further embodiment of the present invention, the second type polymer block is formed to alternate with the first and third types of polymer blocks.

In another embodiment of the present invention, each of the activated areas has a width of X, and a pitch PX between the two nearest activated areas is expressed as follows:

$PX=(4n)*X$, with n being a positive integer.

In another example embodiment of the present invention, each block of the first, second, and third types of polymer blocks has a same width of X.

In a further example embodiment of the present invention, a sequence of the first type polymer block, the second type polymer block, the third type polymer block, another of the second type polymer block, another of the first type polymer block, another of the second type polymer block, another of the third type polymer block, another of the second type polymer block, and another of the first type polymer block are formed adjacent sequentially between the outer edges of the two nearest activated areas.

In an example embodiment of the present invention, the block copolymer is a PMMA (polymethylmetha-acrylate)/PS (polystyrene)/PAMS (polyacrylamide) copolymer. In that case, the first type polymer block is a PMMA (polymethylmetha-acrylate) block, the second type polymer block is a PS (polystyrene) block, and the third type polymer block is a PAMS (polyacrylamide) block. In addition, the activated areas are more hydrophilic than other areas of the image layer.

In a further embodiment of the present invention, the block copolymer includes at least one homopolymer.

In an embodiment of the present invention, at least one type of the first, second, and third types of polymer blocks is removed to pattern a target layer according to at least one type of the first, second, and third types of polymer blocks remaining on the image layer. For example, the second type polymer blocks are removed to pattern a target layer according to the first and third types of polymer blocks remaining on the image layer. Alternatively, the second type polymer blocks and one type of the first type polymer blocks and the third type polymer blocks are removed to pattern a target layer according to one type of the first type polymer blocks and the third type polymer blocks remaining on the image layer.

In an alternative embodiment of the present invention, one type of the first type polymer blocks and the third type polymer blocks are removed to pattern a target layer according to the second type polymer blocks and one type of the first type polymer blocks and the third type polymer blocks remaining on the image layer.

In a method of patterning during integrated circuit fabrication according to another embodiment of the present invention, a plurality of first type polymer blocks, a plurality of second type polymer blocks, and a plurality of third type polymer blocks are formed on an image layer from a block copolymer. The first type polymer blocks, the second type polymer blocks, and the third type polymer blocks are different types from each-other.

Also in such a method of patterning, a first set of at least one block selected from the first, second, and third types of polymer blocks formed on a first area of the image layer are removed. In addition, a second set of at least one block selected from the first, second, and third types of polymer blocks formed on a second area of the image layer are removed. The second set is different from the first set such that different dimensions may be patterned from the block copolymer.

In an example embodiment of the present invention, a first mask is placed over the second area during exposure of the first area for activating decomposition of the first set of polymer blocks to be removed. In addition, a second mask is placed over the first area during exposure of the second area for activating decomposition of the second set of polymer blocks to be removed.

In another embodiment of the present invention, a first remaining set of at least one of the first, second, and third types of polymer blocks on the first area has a first pitch that is different from a second pitch of a second remaining set of at least one of the first, second, and third types of polymer blocks on the second area.

In this manner, multiple repeating patterns of the at least three different types of polymer blocks are formed between the activated areas. When such activated areas are formed from photolithography, dimensions smaller than possible with photolithography may be patterned using such polymer blocks as masking structures. In addition, by having such a wide variety of polymer blocks, different dimensions may be patterned from the layer of block copolymer.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, 18, 19, 20, and 21 refer to elements having similar structure and/or function.

DETAILED DESCRIPTION

Figure 1:
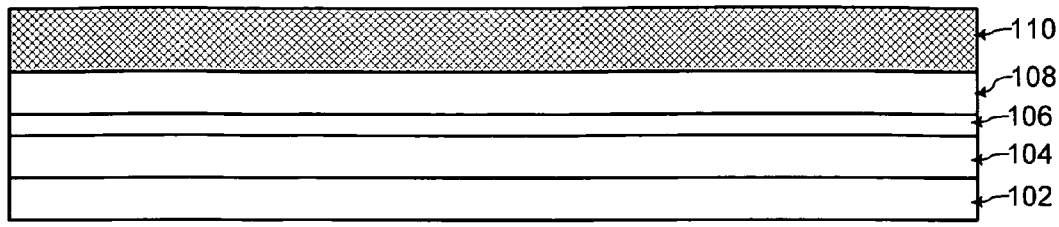
FIGS. 1, 2, 3, 4, 5, and 6 show cross-sectional views during fabrication of different types of polymer blocks between adjacent activated areas, according to an embodiment of the present invention.

FIGS. 1, 2, 3, 4, 5, and 6 show cross-sectional views during fabrication of different types of polymer blocks between adjacent activated areas, according to an embodiment of the present invention. Referring to FIG. 1, a target layer 104 is to be patterned on a base substrate 102 that is a silicon substrate for example. The target layer 104 may be omitted in an alternative embodiment of the present invention for directly patterning the base substrate 102 instead.

The target layer 104 may be an insulating layer comprised of oxide, nitride, or oxynitride, for example. The target layer 104 alternatively may be a metal layer comprised of gold (Au), platinum (Pt), copper (Cu), aluminum (Al), tungsten (W), or silver (Ag), for example. In another example embodiment of the present invention, the target layer 104 is a metal silicide such as tungsten silicide ($WSi_X$), cobalt silicide ($CoSi_X$), or nickel silicide ($NiSi_X$).

Further referring to FIG. 1, an anti-reflective under-layer 106 is formed on the target layer 104 to be patterned. The present invention may be practiced without the anti-reflective under-layer 106 when the target layer 104 is comprised of a similar material as an anti-reflective material. The anti-reflective under-layer 106 is comprised of a silicon-containing material having a maximum of 43% silicon atoms by atomic ratio, such as $SiO_{3/2}$ according to an example embodiment of the present invention.

Also in FIG. 1, a surface treatment using a chemical such as an alkaline solution or HF (hydrogen fluoride) is performed on the anti-reflective under-layer 106 such that Si—OH (silicon hydroxide) is exposed on the surface of the anti-reflective under-layer 106, in an example embodiment of the present invention. If the anti-reflective under-layer 106 is omitted, such a surface treatment is performed on the target layer 104 such that Si—OH (silicon hydroxide) is exposed on the surface of the target layer 104.

If the anti-reflective under-layer 106 is omitted and the target layer 104 is comprised of a metal, such surface treatment may be omitted in an alternative embodiment of the present invention. If the present invention is practiced with the target layer 104 and the anti-reflective under-layer 106 being omitted for patterning the base substrate 102, then the surface treatment is performed on the base substrate 102 such that such that Si—OH (silicon hydroxide) is exposed on the surface of the base substrate 102.

Further referring to FIG. 1, an image layer 108 is formed on the anti-reflective under-layer 106. The image layer 108 is comprised of silane having an organic substituent, a silazane having an organic substituent, a polymer having a chlorosilane group at a terminal, an organic compound having a COBr (carbon oxide bromide) functional group, an organic compound having a thiol group, or an organic compound having a disulfide (—S—S—) bond. For example, the image layer 108 may comprise $(R_1)$—$SiCl_3$, $(R_2)_2$—$SiCl$, $(R_3)_3$—$SiH$, $(R_4)Si(OCH_2CH_3)_3$, $(R_5)Si(OCH_3)_3$, $(R_6)$—$SH$, or $(R_7)$—$S$—$S$—$(R_8)$, with $R_1$, $R_2$, $R_3$, $R_4$, $R_5$, $R_6$, $R_7$, and $R_8$ each independently being a $C_1$ to $C_{20}$ substituted or unsubstituted aliphatic or aromatic hydrocarbon group.

The image layer 108 is comprised of a homopolymer (such as a polystyrene, polyhydroxystyrene, or polymethylmethacylate for example) or a random polymer (polyhydroxystyrene-polymethylmethacrylate for example), having a trichlorosilane group at a terminal. In another embodiment of the present invention, the image layer 108 includes a self-assembled monolayer.

For example, the image layer 108 includes chlorosilane that is reacted with the OH functional group exposed on the silicon containing under-layer 106 to form the Si—O—Si bond, thereby forming a self-assembled monolayer as the image layer 108 on the under-layer 106. Alternatively for instance, the image layer 108 includes an organic compound having an anchoring group such as a thiol group or a silane group or a disulfide (—S—S—) bond that are self-assembled on the under-layer 108 that is a metal.

Further referring to FIG. 1, a photo-resist layer 110 is deposited on the image layer 108. In addition referring to FIGS. 1 and 2, the photo-resist layer 110 is patterned to form openings 112 therein using photo-lithography technology. Photo-lithography for patterning a photo-resist layer in general and individually is known to one of ordinary skill in the art of integrated circuit fabrication. Each of the openings 112 has a width of X, and in that case, a pitch between the neighboring openings 112 is PX=(4*n)*X, with n being a positive integer, in an embodiment of the present invention.

Figure 2:
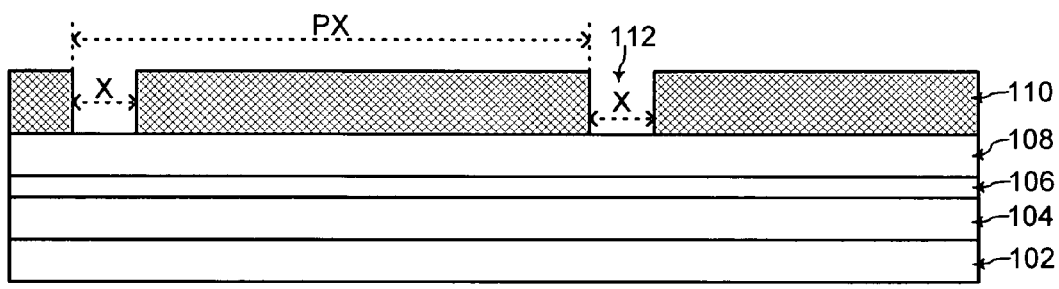
Figure 3:
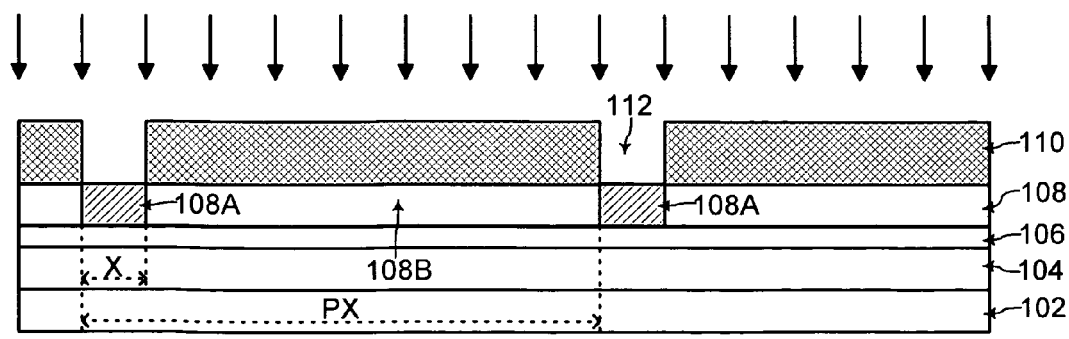

Referring to FIGS. 2 and 3, an external impetus (represented by arrows in FIG. 3) is applied to exposed portions 108A of the image layer 108. The surface of the exposed portions 108 of the image layer 108 is activated by the external impetus. Covered portions 108B of the image layer 108 disposed under the photo-resist material 110 are not activated since the photo-resist material 110 blocks the external impetus.

The external impetus in FIG. 3 is DUV (deep ultra violet) light radiation, soft X-ray radiation, an electron-beam, or an oxygen plasma, in an example embodiment of the present invention. Accordingly, the exposed portions 108A of the image layer 108 are oxidized such that the exposed surface of each of the exposed portions 108A becomes more hydrophilic than the non-exposed portions 108B.

Thus, the surface or interfacial energy of the exposed surface of each of the exposed portions 108A of the image layer 108 is changed by the exterior impetus to form activated areas 108A of the image layer 108. For example when the external impetus is a oxygen plasma treatment, the surface energy of the exposed surfaces of the exposed portions 108A of the image layer 108 is changed to enhance hydrophilicity and wettability of such exposed surfaces with polar groups in a block copolymer to be deposited thereon.

Subsequently referring to FIG. 4, the photo-resist layer 110 is removed, and a layer of block copolymer 114 is deposited onto the image layer 108. The block copolymer 114 is a triblock copolymer comprised of first, second, and third polymer blocks in an example embodiment of the present invention. Such first, second, and third polymer blocks are different from each other and immiscible with one another (i.e., insoluble in on another), in an example embodiment of the present invention. The block copolymer 114 has a molecular weight of from about 3,000 to about 2,000,000 grams/mole, in an example embodiment of the present invention.

In an example embodiment of the present invention, the block copolymer 114 is comprised of one of: polystyrene/polymethylmethacrylate/polyalphamethylstyrene copolymer, polybutadiene/polybutylmethacrylate/polyalphamethylstyrene copolymer, polybutadiene/polydimethylsiloxane/polyalphamethylstyrene copolymer, polybutadiene/polymethylmethacrylate/polyalphamethylstyrene copolymer, polybutadiene/polyvinylpyridine/polyalphamethylstyrene copolymer, polybutylacrylate/polymethylmethacrylate/polyalphamethylstyrene copolymer, polybutylacrylate/polyvinylpyridine/polyalphamethylstyrene copolymer, polyisoprene/polyvinylpyridine/polyalphamethylstyrene copolymer, polyisoprene/polymethylmethacrylate/polyalphamethylstyrene copolymer, polyhexylacrylate/polyvinylpyridine/polyalphamethylstyrene copolymer, polyisobutylene/polybutylmethacrylate/polyalphamethylstyrene copolymer, polyisobutylene/polymethylmethacrylate/polyalphamethylstyrene copolymer, polyisobutylene/polydimethylsiloxane/polyalphamethylstyrene copolymer, polybutylmethacrylate/polybutylacrylate/polyalphamethylstyrene copolymer, polyethylethylene/polymethylmethacrylate/polyalphamethylstyrene copolymer, polystyrene/polybutylmethacrylate/polyalphamethylstyrene copolymer, polystyrene/polybutadiene/polyalphamethylstyrene copolymer, polystyrene/polyisoprene/polyalphamethylstyrene copolymer, polystyrene/polydimethylsiloxane/polyalphamethylstyrene copolymer, polystyrene/polyvinylpyridine/polyalphamethylstyrene copolymer, polyethylethylene/polyvinylpyridine/polyalphamethylstyrene copolymer, polyethylene/polyvinylpyridine/polyalphamethylstyrene copolymer, polyvinylpyridine/polymethylmethacrylate/polyalphamethylstyrene copolymer, polyethyleneoxide/polyisoprene/polyalphamethylstyrene copolymer, polyethyleneoxide/polybutadiene/polyalphamethylstyrene copolymer, polyethyleneoxide/polystyrene/polyalphamethylstyrene copolymer, polyethyleneoxide/polymethylmethacrylate/polyalphamethylstyrene copolymer, polyethyleneoxide/polydimethylsiloxane/polyalphamethylstyrene copolymer, or polystyrene/polyethyleneoxide/polyalphamethylstyrene copolymer.

However, the present invention may also be practiced with other copolymer block material than such examples.

The layer of block copolymer 114 may be comprised of one of such example triblock copolymers in an example embodiment of the present invention. Alternatively, the layer of block copolymer 114 may also includes a homopolymer in addition to the copolymer. Such a homopolymer has a repeating monomer unit with a chemical structure that is same as that of a repeating monomer unit of one of the three polymer blocks comprising the triblock copolymer.

The present invention may also be practiced when the layer of block copolymer 114 includes two kinds of homopolymers (first and second homopolymers) in addition to the copolymer. In that case, the first homopolymer has a repeating monomer unit with a chemical structure that is same as that of a repeating monomer unit of one of the three polymer blocks comprising the triblock copolymer. Also, the second homopolymer has a repeating monomer unit with a chemical structure that is same as that of a repeating monomer unit of another of the three polymer blocks comprising the triblock copolymer.

In any case, the addition of the at least one homopolymer to the layer of block copolymer 114 results in shortening of self-assembling time of the copolymer 114. Also, the addition of the at least one homopolymer to the layer of block copolymer 114 may enlarge the pitch of the self-assembled blocks formed from the copolymer 114.

Subsequently referring to FIG. 5, the layer of block copolymer 114 is activated by thermal annealing at a temperature that is greater than a glass transition temperature Tg of the copolymer 114. Such activation results in phase separation with rearrangement of the three different types of polymer blocks in the copolymer 114 dictated by the activated areas 108A of the under-layer 108. In an example embodiment of the present invention, the glass transition temperature Tg of the copolymer 114 is in a range of from about 130° Celsius to about 190° Celsius. The copolymer 114 is annealed for a time period of from about 1 hour to about 24 hours depending on the composition of the copolymer 114 and the annealing temperature.

Figure 5:
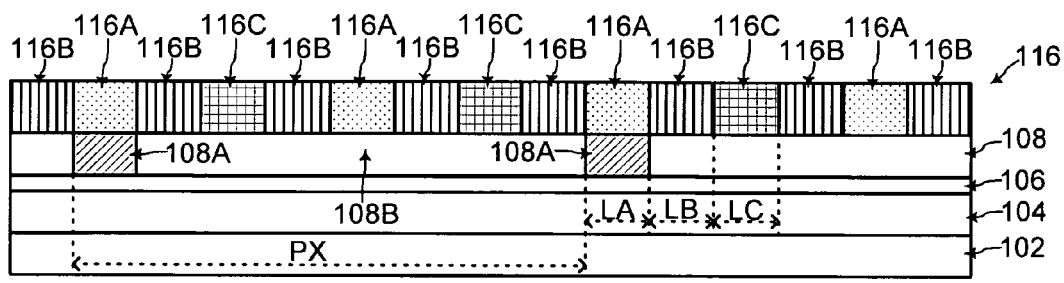

Further referring to FIG. 5, the layer of block copolymer 114 is phase separated into a plurality of first type polymer blocks 116A, a plurality of second type polymer blocks 116B, and a plurality of third type polymer blocks 116C to form a phase separated polymer block pattern 116. The phase separated polymer block pattern 116 has a sequence of the first type polymer block 116A, then the second type polymer block 116B, then the third type polymer block 116C, and then the second type polymer block 116B. Such a pattern of the polymer blocks 116A, then 116B, then 116C, and then 116B is repeated. Thus, the second type polymer block 116B alternates with the first and third types of polymer blocks 116A and 116C.

With such phase separation in FIG. 5, one terminal of the second type polymer block 116B is anchored by a covalent bond at a terminal of the first type polymer block 116A. Another terminal of the second type polymer block 116B is anchored by a covalent bond at a terminal of the third type polymer block 116C.

Also referring to FIG. 5, each of the activation areas 108A has the first type polymer block 116A formed thereon. The first, second, and third types of polymer blocks 116A, 116B, and 116C have different monomer units from each-other such that the first, second, and third types of polymer blocks 116A,

161B, and 116C are different from each-other. Thus, the first, second, and third types of polymer blocks 116A, 116B, and 116C are comprised of different materials.

Further referring to FIG. 5, the first type polymer blocks 116A, that has higher polarity than the second and third type polymer blocks 116B and 116C, are formed at the activated areas 108A of the under-layer. Thus, the pitch PX between the two nearest activated areas 108A determines the pattern of the first, second, and third types of polymer blocks 116A, 116B, and 116C.

Also referring to FIG. 5, each first type polymer block 116A has a respective width LA, each second type polymer block 116B has a respective width LB, and each third type polymer block 116C has a respective width LC. In one embodiment of the present invention, such respective widths are substantially equal such that LA=LB=LC=X of FIG. 3. Further in that case in an example embodiment of the present invention in FIG. 5, the pitch PX between the two nearest activated areas 108A is substantially equal to 8*X.

Figure 4:
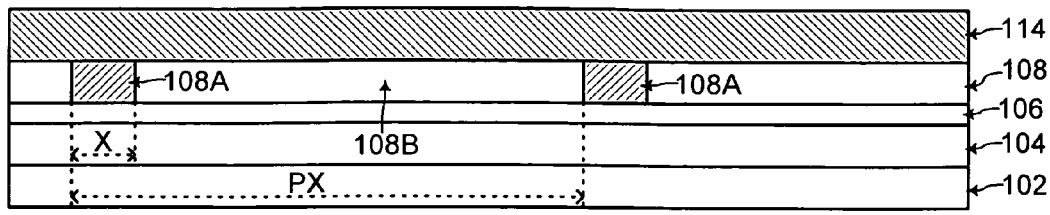

The respective widths LA, LB, and LC are determined by the respective molecular weight of each of the respective monomer units of the three types of polymer blocks in the copolymer block 114 in FIG. 4. Such molecular weights of the three types of polymer blocks may be selected such that LA=LB=LC=X.

In that case of FIG. 5, a respective pitch PA between the two nearest first type polymer blocks 116A is substantially equal to 4*X. In addition, a respective pitch PB between the two nearest second type polymer blocks 116B is substantially equal to 2*X. Furthermore, a respective pitch PC between the two nearest third type polymer blocks 116C is substantially equal to 4*X. Generally, PA=PC=PX/n, and PB=PX/(2*n), with n being a positive integer, according to an example embodiment of the present invention.

According to an aspect of the present invention, pitch multiplication is achieved with multiple first type polymer blocks 116A, multiple second type polymer blocks 116B, and multiple third type polymer blocks 116C being formed on an area of the under-layer 108 between the outer edges of the two nearest activated areas 108A. In the example of FIG. 5, the area of the under-layer 108 between the outer edges of the two nearest activated areas 108A has formed thereon three of the first type polymer blocks 116A, four of the second type polymer blocks 116B, and two of the third type polymer blocks 116C.

In an example embodiment of the present invention, the copolymer block 114 is a PMMA (polymethylmetha-acrylate)/PS (polystyrene)/PAMS (polyacrylamide) copolymer. In that case, the first type polymer block 116A is a PMMA (polymethylmetha-acrylate) block, the second type polymer block 116B is a PS (polystyrene) block, and the third type polymer block 116C is a PAMS (polyacrylamide) block.

Subsequently referring to FIG. 6, the polymer blocks 116 are exposed to a decomposing impetus (indicate by arrows in FIG. 6) that selectively activates decomposition of at least one of the types of polymer blocks 116A, 116B, and 116C more than the other types. For example, the decomposing impetus is radiation, plasma such as $O_2$ plasma, DUV (deep ultra violet) light, soft X-ray, or an electron beam.

For the case of the first, second, and third types of polymer blocks 116A, 116B, and 116C being PMMA, PS, and PAMS, respectively, the polymer blocks 116 are exposed to radiation with energy that is higher than a threshold energy for decomposing the third type polymer blocks PAMS but that is lower than threshold energies for decomposing the first and second types of polymer blocks PMMA and PS, in an example embodiment of the present invention. The radiation energy may be controlled by the time duration of applying the external impetus such as the radiation or the plasma.

Figure 7:
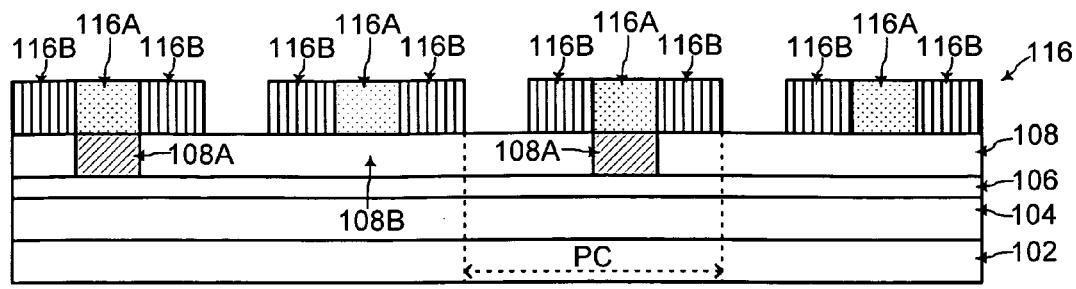
FIGS. 7, 8, and 9 show cross-sectional views for patterning a target layer after removing one type of polymer blocks in FIG. 6, according to an embodiment of the present invention.

Thereafter referring to FIG. 7, the third type polymer blocks 116C that have been decomposed are selectively stripped away. Thus in FIG. 7, the first and second types of polymer blocks 116A and 116B remain to form a mask pattern having a pitch of PC=LA+2*LB+LC=4*X when LA=LB=LC=X. Subsequently referring to FIG. 8, the mask pattern of the remaining first and second types of polymer blocks 116A and 116B is used to etch away exposed portions of the image layer 108, the anti-reflective under-layer 106, and the target layer 104.

Figure 8:
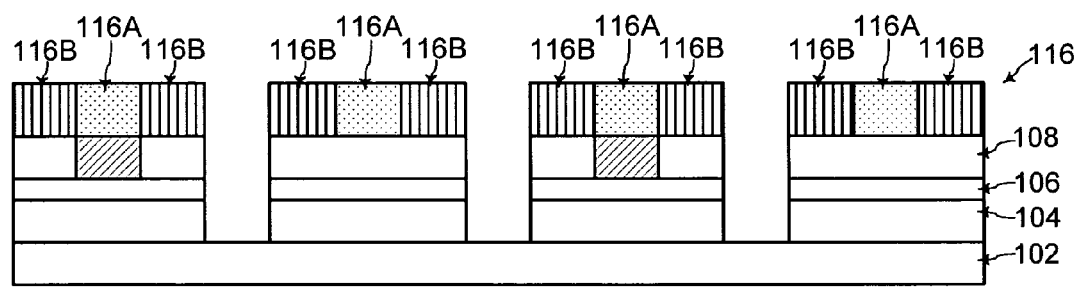
Figure 9:
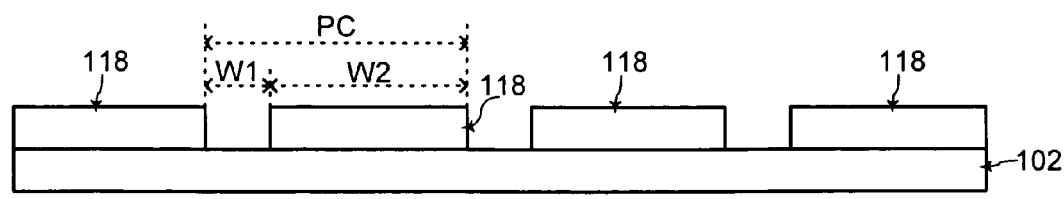

Referring to FIGS. 8 and 9, the remaining portions of the polymer blocks 116A and 116B, the image layer 108, and the anti-reflective under-layer 106 are etched away from the remaining portions of the target layer 104 to form a fine pattern of patterned structures 118. The fine pattern of the patterned structures 118 formed from the remaining portions of the target layer 104 has the pitch PC=4*X. The patterned structures 118 are separated from each-other by a first width W1=LC, and each of the patterned structures 118 has a second width of W2=LA+2*LB. For the example case of LA=LB=LC=X, W1=X, and W2=3*X.

Figure 6:
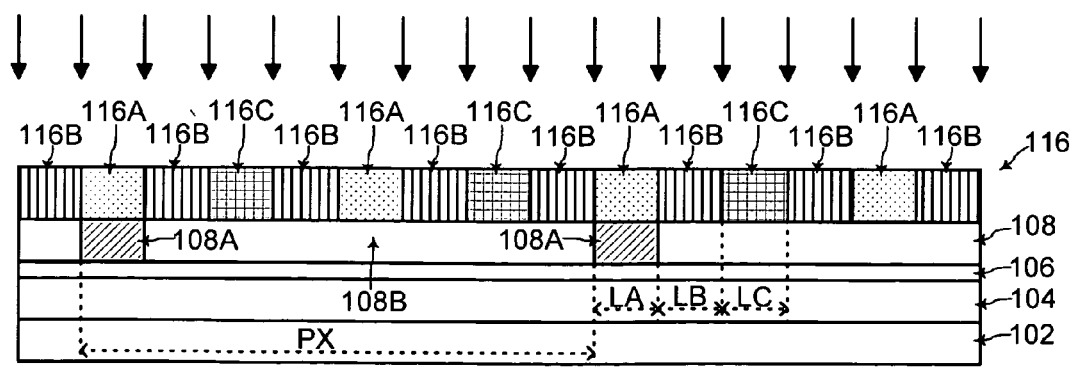
Figure 10:
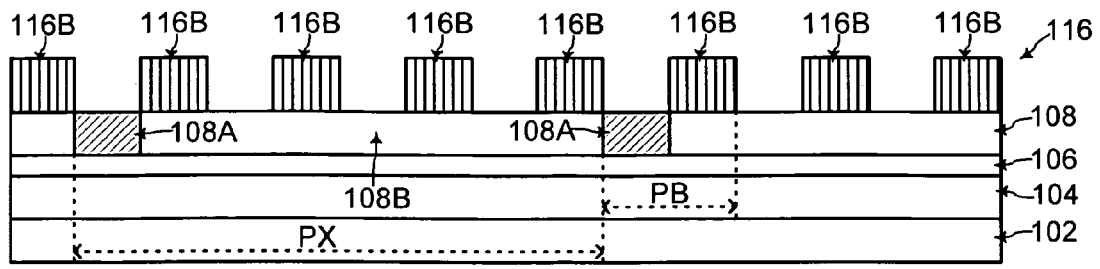
FIGS. 10, 11, and 12 show cross-sectional views for patterning a target layer after removing two types of polymer blocks in FIG. 6, according to another embodiment of the present invention.

Referring to FIG. 10 after FIG. 6 for an alternative embodiment of the present invention, both of the first and third types of polymer blocks 116A and 116C are selectively removed. Thus in FIG. 10, the second type polymer blocks 116B remain to form a mask pattern having a pitch of PB=LA+LB or LC+LB with PB=2*X when LA=LB=LC=X. Subsequently referring to FIG. 11, the mask pattern of the remaining second type polymer blocks 116B is used to etch away exposed portions of the image layer 108, the anti-reflective under-layer 106, and the target layer 104.

Figure 11:
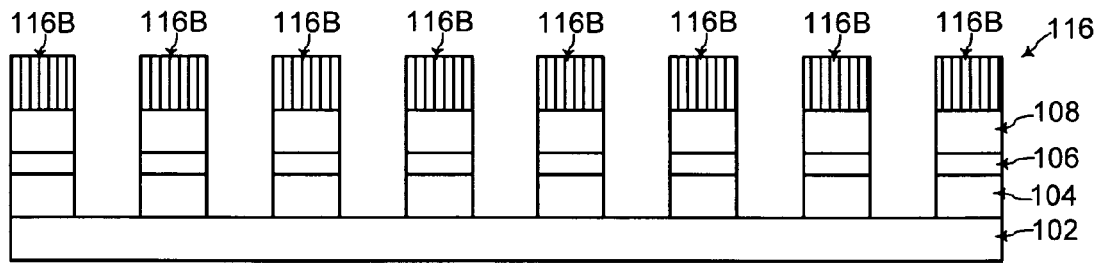
Figure 12:
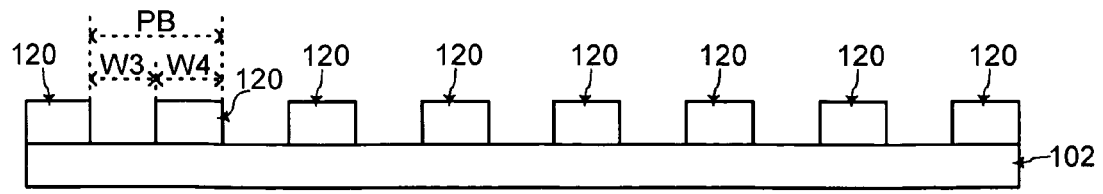

Referring to FIGS. 11 and 12, the remaining portions of the polymer blocks 116B, the image layer 108, and the anti-reflective under-layer 106 are etched away from the remaining portions of the target layer 104 to form a fine pattern of patterned structures 120. The fine pattern of the patterned structures 120 formed from the remaining portions of the target layer 104 has the pitch PB=LA+LB or LC+LB with PB=2*X when LA=LB=LC=X. The patterned structures 120 are separated from each-other by a third width W3=LA=LC, and each of the patterned structures 120 has a fourth width of W4=LB. For the example case of LA=LB=LC=X, W3=X, and W4=X.

Figure 13:
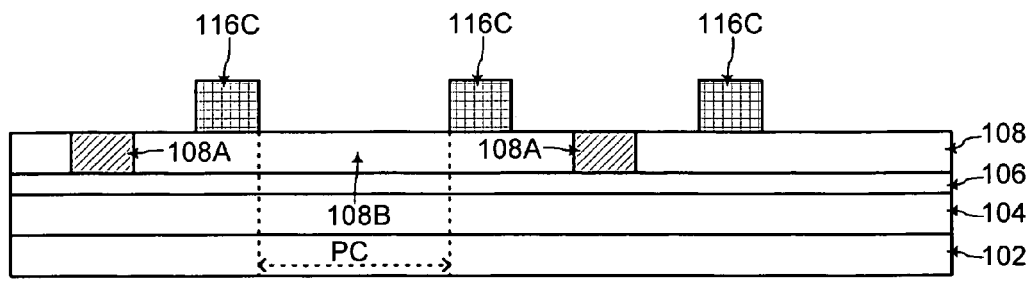
FIGS. 13, 14, and 15 show cross-sectional views for patterning a target layer after removing another two types of polymer blocks in FIG. 6, according to another embodiment of the present invention.

Referring to FIG. 13 after FIG. 6 for an alternative embodiment of the present invention, both of the first and second types of polymer blocks 116A and 116B are selectively removed. Thus in FIG. 13, the third type of polymer blocks 116C remain to form a mask pattern having a pitch of PC=4*X. Subsequently referring to FIG. 14, the mask pattern of the remaining third type polymer blocks 116C is used to etch away exposed portions of the image layer 108, the anti-reflective under-layer 106, and the target layer 104.

Figure 14:
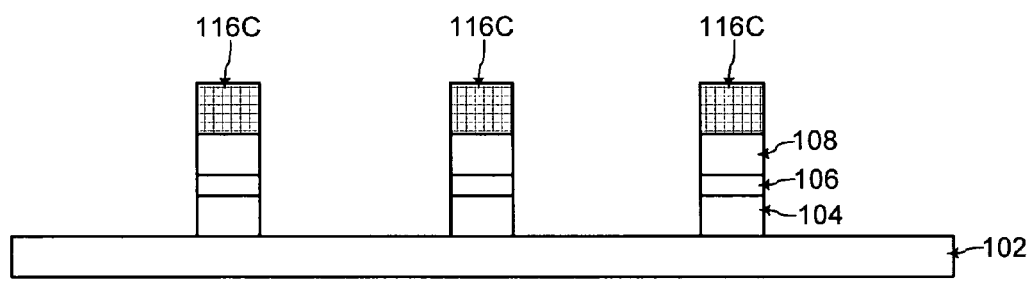
Figure 15:
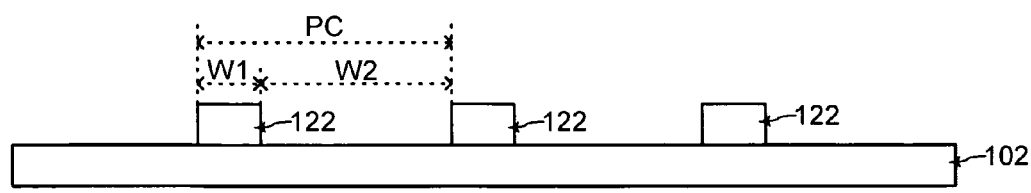

Referring to FIGS. 14 and 15, the remaining portions of the polymer blocks 116C, the image layer 108, and the anti-reflective under-layer 106 are etched away from the remaining portions of the target layer 104 to form a fine pattern of patterned structures 122. The fine pattern of the patterned structures 122 formed from the remaining portions of the target layer 104 has the pitch PC=4*X. The patterned structures 122 are separated from each-other by the second width W2=LA+2*LB, and each of the patterned structures 122 has the first width W1=LC. For the example case of LA=LB=LC=X, W1=X, and W2=3*X.

Figure 16:
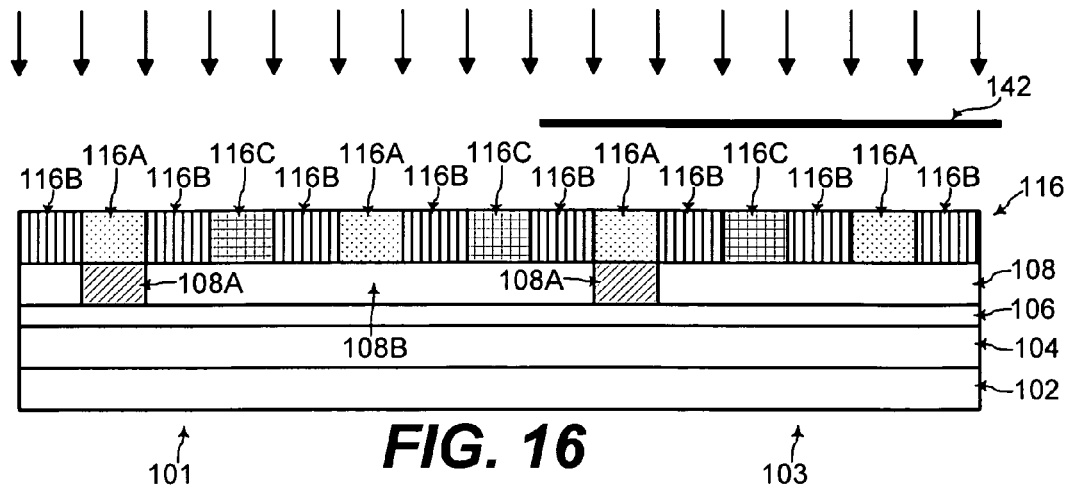
FIGS. 16, 17, 18, 19, 20, and 21 show cross-sectional views for patterning areas of a target layer differently after FIG. 6, according to another embodiment of the present invention.

Referring to FIG. 16 after FIG. 6 for an alternative embodiment of the present invention, the polymer blocks 116A, 116B, and 116C formed on a first area 101 of the image layer 108 are exposed to a decomposing impetus (indicate by arrows in FIG. 16) that selectively activates decomposition of the third type polymer blocks 116C. At the same time in FIG. 16, a first mask 142 is placed over the polymer blocks 116A, 116B, and 116C formed on a second area 103 of the image layer 108. Thus, the first mask 142 blocks the decomposing impetus from reaching the third type polymer blocks 116C formed over the second area 103.

Figure 17:
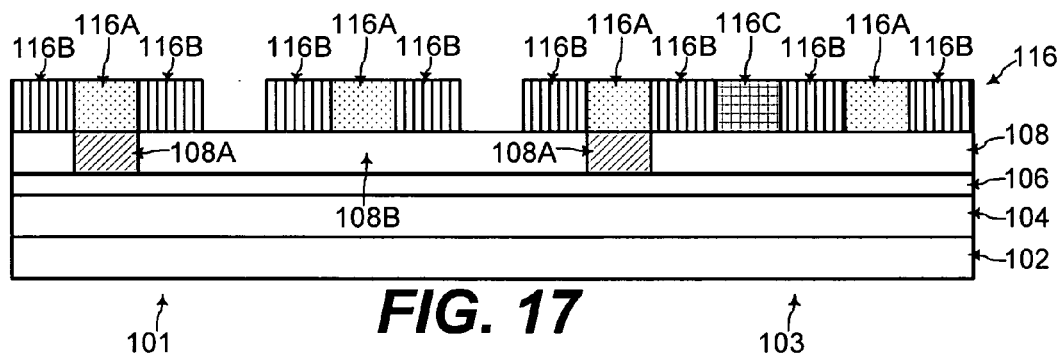

Thereafter referring to FIG. 17, the third type polymer blocks 116C over the first area 101 that have been decomposed are selectively stripped away. Thus in FIG. 17, the first and second types of polymer blocks 116A and 116B remain to form a first mask pattern over the first area 101. However in FIG. 17, the first, second, and third types of polymer blocks 116A, 116B, and 116C remain over the second area 103.

Figure 18:
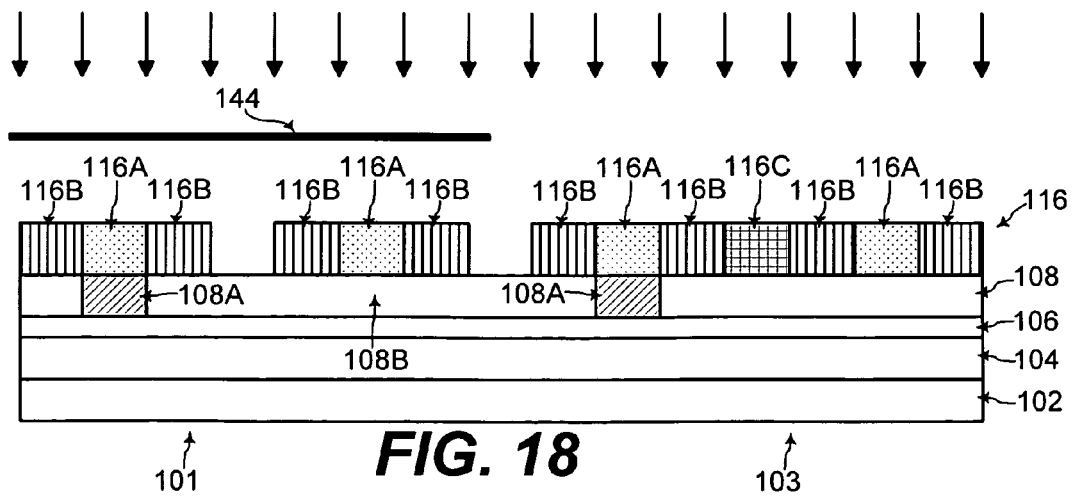

Subsequently referring to FIG. 18, the polymer blocks 116A, 116B, and 116C formed on the second area 103 of the image layer 108 are exposed to a decomposing impetus (indicate by arrows in FIG. 18) that selectively activates decomposition of the first and third types of polymer blocks 116A and 116C. At the same time in FIG. 18, a second mask 144 is placed over the polymer blocks 116A and 116B remaining on the first area 101 of the image layer 108. Thus, the second mask 144 blocks the decomposing impetus from reaching the remaining polymer blocks 116A and 116B formed over the first area 101.

Figure 19:
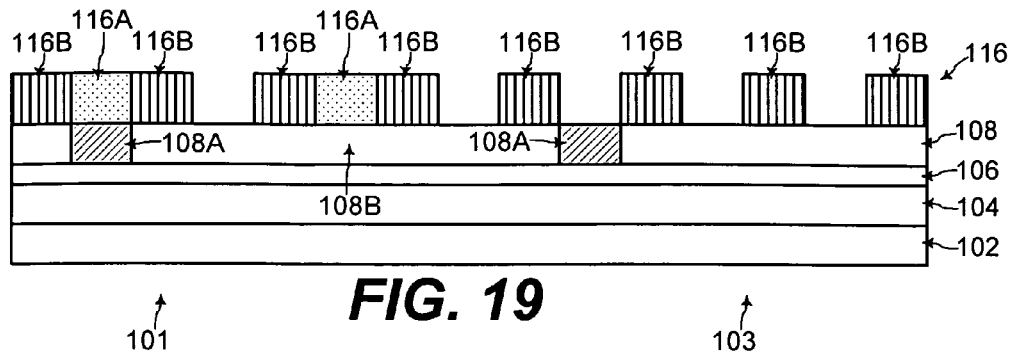

Thereafter referring to FIG. 19, the first and third types of polymer blocks 116A and 116C over the second area 103 that have been decomposed are selectively stripped away. Thus in FIG. 19, the second type polymer blocks 116B remain to form a second mask pattern over the second area 103. However in FIG. 19, the first and second types of polymer blocks 116A and 116B forming the first mask pattern remain over the first area 101.

Subsequently referring to FIG. 20, the first mask pattern of the remaining the first and second types of polymer blocks 116A and 116B is used to etch away exposed portions of the image layer 108, the anti-reflective under-layer 106, and the target layer 104 in the first area 101. Also referring to FIG. 20, the second mask pattern of the remaining second type polymer blocks 116B is used to etch away exposed portions of the image layer 108, the anti-reflective under-layer 106, and the target layer 104 in the second area 103.

Figure 20:
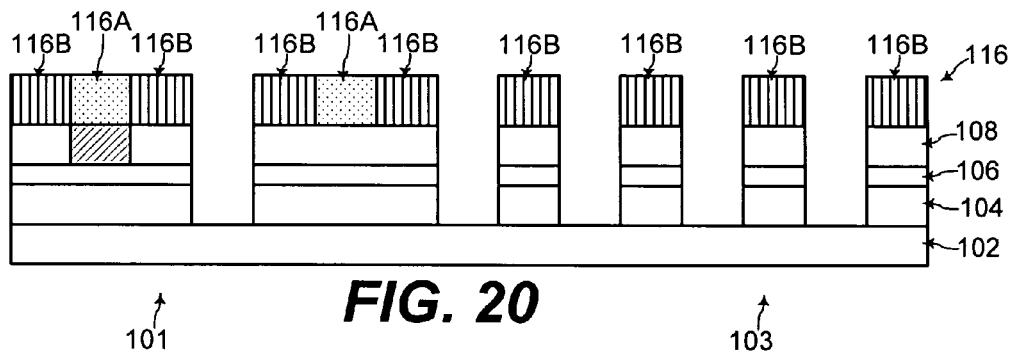
Figure 21:
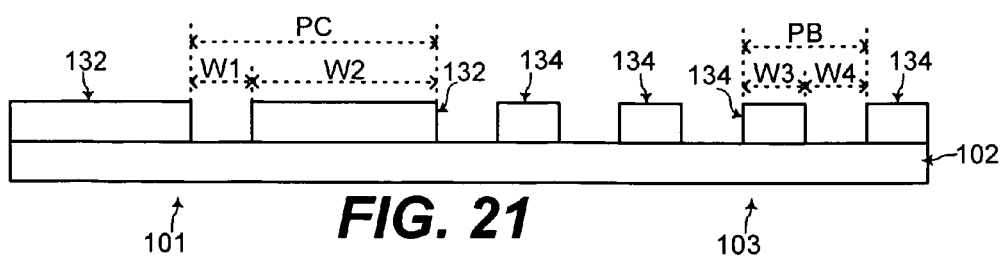

Referring to FIGS. 20 and 21, the remaining portions of the polymer blocks 116A and 116B, the image layer 108, and the anti-reflective under-layer 106 in the first area 101 are etched away from the remaining portions of the target layer 104 to form a first fine pattern of first patterned structures 132. The first fine pattern of the first patterned structures 132 formed from the remaining portions of the target layer 104 in FIG. 21 has the pitch PC=LA+2*LB+LC=4*X when LA=LB=LC=X. The patterned structures 132 are separated from each-other by the first width W1=LC, and each of the patterned structures 132 has the second width of W2=LA+2*LB. For the example case of LA=LB=LC=X, W1=X, and W2=3*X, in FIG. 21.

Also referring to FIG. 21, the remaining portions of the polymer blocks 116B, the image layer 108, and the anti-reflective under-layer 106 in the second area 103 are etched away from the remaining portions of the target layer 104 to form a second fine pattern of second patterned structures 134. The second fine pattern of the second patterned structures 134 formed from the remaining portions of the target layer 104 has the pitch PB=LA+LB or LC+LB with PB=2*X when LA=LB=LC=X. The second patterned structures 134 are separated from each-other by the third width W3=LA=LC, and each of the patterned structures 134 has the fourth width of W4=LB. For the example case of LA=LB=LC=X, W3=X, and W4=X.

In this manner, the patterned structures 132 and 134 with different pitches PC and PB may be formed in the different areas 101 and 103. In addition, a variety of patterned structures 118, 120, and 122 with various pitches, dimensions, and separation distances may be effectively formed with the present invention. In addition, using the block copolymer for bottom-up patterning to form the mask structures, dimensions smaller than limits of traditional photolithography may be achieved.

The foregoing is by way of example only and is not intended to be limiting. Thus, any dimensions or number of elements or any materials as illustrated and described herein are by way of example only. The present invention is limited only as defined in the following claims and equivalents thereof.

The invention claimed is:

1. A method of patterning during integrated circuit fabrication, the method comprising:
   activating an image layer for forming a respective first type polymer block at each of two nearest activated areas;
   forming a layer of block copolymer on the image layer;
   forming a plurality of the first type polymer blocks, a plurality of second type polymer blocks, and a plurality of third type polymer blocks on an area of the image layer between outer edges of the two nearest activated areas, from the block copolymer,
   wherein the first type polymer blocks, the second type polymer blocks, and the third type polymer blocks are different types from each-other; and
   forming two of the first type polymer blocks, four of the second type polymer blocks, and two of the third type polymer blocks on a pitch PX between the two nearest activated areas.

2. The method of claim 1, further comprising:
   forming the second type polymer block to alternate with the first and third types of polymer blocks.

3. The method of claim 2, wherein each of the activated areas has a width of X, and wherein said pitch PX between the two nearest activated areas is expressed as follows:

$$PX=(4n)*X, \text{ with n being a positive integer.}$$

4. The method of claim 3, wherein each block of the first, second, and third types of polymer blocks has a same width of X.

5. The method of claim 1, further comprising:
   forming a sequence of the first type polymer block, the second type polymer block, the third type polymer block, another of the second type polymer block, another of the first type polymer block, another of the second type polymer block, another of the third type polymer block, another of the second type polymer block, and another of the first type polymer block, adjacent sequentially between the outer edges of the two nearest activated areas.

6. The method of claim 5, wherein the block copolymer is a PMMA (polymethylmetha-acrylate)/PS (polystyrene)/PAMS (polyacrylamide) copolymer.

7. The method of claim 6, wherein the first type polymer block is a PMMA (polymethylmetha-acrylate) block, and wherein the second type polymer block is a PS (polystyrene) block, and wherein the third type polymer block is a PAMS (polyacrylamide) block.

8. The method of claim 7, wherein the activated areas are more hydrophilic than other areas of the image layer.

9. The method of claim 1, wherein the activated areas are more hydrophilic than other areas of the image layer.

10. The method of claim 1, wherein the block copolymer includes at least one homopolymer.

11. The method of claim 1, further comprising:
forming the second type polymer block to alternate with the first and third types of polymer blocks.

12. The method of claim 11, further comprising:
removing the second type polymer blocks to pattern a target layer according to the first and third types of polymer blocks remaining on the image layer.

13. A method of patterning during integrated circuit fabrication, the method comprising:
activating an image layer for forming a respective first type polymer block at each of two nearest activated areas;
forming a layer of block copolymer on the image layer; and
forming a plurality of the first type polymer blocks, a plurality of second type polymer blocks, and a plurality of third type polymer blocks on an area of the image layer between outer edges of the two nearest activated areas, from the block copolymer,
wherein the first type polymer blocks, the second type polymer blocks, and the third type polymer blocks are different types from each-other;
forming the second type polymer block to alternate with the first and third types of polymer blocks; and
removing the second type polymer blocks and one type of the first type polymer blocks and the third type polymer blocks to pattern a target layer according to one type of the first type polymer blocks and the third type polymer blocks remaining on the image layer.

14. A method of patterning during integrated circuit fabrication, the method comprising:
activating an image layer for forming a respective first type polymer block at each of two nearest activated areas;
forming a layer of block copolymer on the image layer; and
forming a plurality of the first type polymer blocks, a plurality of second type polymer blocks, and a plurality of third type polymer blocks on an area of the image layer between outer edges of the two nearest activated areas, from the block copolymer,
wherein the first type polymer blocks, the second type polymer blocks, and the third type polymer blocks are different types from each-other;
forming the second type polymer block to alternate with the first and third types of polymer blocks; and
removing one type of the first type polymer blocks and the third type polymer blocks to pattern a target layer according to the second type polymer blocks and one type of the first type polymer blocks and the third type polymer blocks remaining on the image layer.

15. A method of patterning during integrated circuit fabrication, the method comprising:
activating an image layer for forming a respective first type polymer block at each of two nearest activated areas;
forming a layer of block copolymer on the image layer; and
forming a plurality of the first type polymer blocks, a plurality of second type polymer blocks, and a plurality of third type polymer blocks on an area of image layer between outer edges of the two nearest activated areas, from the block copolymer,
wherein the first type polymer blocks, the second type polymer blocks, and the third type polymer blocks are different types from each-other;
forming the second type polymer block to alternate with the first and third types of polymer blocks;
removing a first set of at least one block selected from the first, second, and third types of polymer blocks formed on a first area of the image layer; and
removing a second set of at least one block selected from the first, second, and third types of polymer blocks formed on a second area of the image layer, wherein the second set is different from the first set,
and wherein a first remaining set of at least one of the first, and third types of polymer blocks on said first area has a first pitch that is different from a second pitch of a second remaining set of at least one of the first, second, and third types of polymer blocks on said second area.

16. The method of claim 1, further comprising:
removing at least one type of the first, second, and third types of polymer blocks to pattern a target layer according to at least one type of the first, second, and third types of polymer blocks remaining on the image layer.

17. A method of patterning during integrated circuit fabrication, the method comprising:
activating an image layer for forming a respective first type polymer block at each of two nearest activated areas;
forming a layer of block copolymer on the image layer;
forming a plurality of the first type polymer blocks, a plurality of second type polymer blocks, and a plurality of third type polymer blocks on an area of the image layer between outer edges of the two nearest activated areas, from the block copolymer,
wherein the first type polymer blocks, the second type polymer blocks, and the third type polymer blocks are different types from each-other;
removing a first set of at least one block selected from the first, second, and third types of polymer blocks on a first area of the image layer; and
removing a second set of at least one block selected from the first, second, and third types of polymer blocks on a second area of the image layer,
wherein the second set is different from the first set such that a first remaining set of the first, second, and third types of polymer blocks on said first area has a first pitch that is different from a second pitch of a second remaining set of the first, second, and third types of polymer blocks on said second area.

18. A method of patterning during integrated circuit fabrication, the method comprising:
forming a plurality of first type polymer blocks, a plurality of second type polymer blocks, and a plurality of third type polymer blocks on an image layer from a block copolymer;
wherein the first type polymer block, the second type polymer blocks, and the third type polymer blocks are different types from each-other;
removing a first set of at least one block selected from the first, second, and third types of polymer blocks formed on a first area of the image layer; and
removing a second set of at least one block selected from the first, second, and third types of polymer blocks formed on a second area of the image layer, wherein the second set is different from the first set.

19. The method of claim 18, further comprising:
placing a first mask over the second area during exposure of the first area for activating decomposition of the first set of polymer blocks to be removed; and
placing a second mask over the first area during exposure of the second area for activating decomposition of the second set of polymer blocks to be removed.

20. The method of claim 18, wherein a first remaining set of at least one of the first, second, and third types of polymer blocks on said first area has a first pitch that is different from a second pitch of a second remaining set of at least one of the first, second, and third types of polymer blocks on said second area.

21. The method of claim 18, further comprising:
activating the image layer for forming a respective one of the first type polymer block at each of two nearest activated areas; and
forming the first type polymer blocks, the second type polymer blocks, and the third type polymer blocks on an area of the image layer between outer edges of the two nearest activated areas.

22. The method of claim 21, further comprising:
forming the second type polymer block to alternate with the first and third types of polymer blocks,
wherein each of the activated areas has a width of X, and wherein a pitch PX between the two nearest activated areas is expressed as follows:

$PX=(4n)*X$, with n being a positive integer.

23. The method of claim 22, wherein each block of the first, second, and third types of polymer blocks has a same width of X.

24. The method of claim 22, further comprising:
forming a sequence of the first type polymer block, the second type polymer block, the third type polymer block, another of the second type polymer block, another of the first type polymer block, another of the second type polymer block, another of the third type polymer block, another of the second type polymer block, and another of the first type polymer block, adjacent sequentially between the outer edges of the two nearest activated areas,
wherein the first type polymer block is a PMMA (polymethylmetha-acrylate) block, and wherein the second type polymer block is a PS (polystyrene) block, and wherein the third type polymer block is a PAMS (polyacrylamide) block.

* * * * *